US008329060B2

(12) United States Patent
Setlur et al.

(10) Patent No.: US 8,329,060 B2
(45) Date of Patent: *Dec. 11, 2012

(54) BLUE-GREEN AND GREEN PHOSPHORS FOR LIGHTING APPLICATIONS

(75) Inventors: Anant Achyut Setlur, Niskayuna, NY (US); Ramachandran Gopi Chandran, Bangalore (IN); Claire Susan Henderson, Schenectady, NY (US); Pransanth Kumar Nammalwar, Bangalore (IN); Emil Radkov, Euclid, OH (US)

(73) Assignee: General Electric Company, Niskayuna, NY (US)

( * ) Notice: Subject to any disclaimer, the term of this patent is extended or adjusted under 35 U.S.C. 154(b) by 666 days.

This patent is subject to a terminal disclaimer.

(21) Appl. No.: 12/256,142

(22) Filed: Oct. 22, 2008

(65) Prior Publication Data

US 2010/0096974 A1    Apr. 22, 2010

(51) Int. Cl.
*C09K 11/08* (2006.01)
*C09K 11/61* (2006.01)
*H01J 29/10* (2006.01)

(52) U.S. Cl. .................. 252/301.4 H; 313/468

(58) Field of Classification Search .......... 252/301.4 H, 252/301.6 R, 301.4 R; 313/467, 468, 503, 313/565, 567, 571
See application file for complete search history.

(56) References Cited

U.S. PATENT DOCUMENTS

| 4,748,395 A | 5/1988 | Reynolds |
| 5,874,491 A | 2/1999 | Anders |
| 5,961,072 A | 10/1999 | Bodle |
| 6,005,024 A | 12/1999 | Anders et al. |
| 6,074,739 A | 6/2000 | Katagiri |
| 6,123,871 A | 9/2000 | Carroll |
| 6,190,577 B1 | 2/2001 | Hase et al. |
| 6,276,634 B1 | 8/2001 | Bodie |
| 6,280,655 B1 | 8/2001 | Xu et al. |
| 6,375,864 B1 | 4/2002 | Phillips et al. |
| 6,613,137 B2 | 9/2003 | Egger et al. |

(Continued)

FOREIGN PATENT DOCUMENTS

CN    101270286 A    9/2008

(Continued)

OTHER PUBLICATIONS

Im et al., "Substitution of Oxygen by Fluorine in the GdSr2Al5:Ce3+ Phosphors; Gd1-xSr2+xFx Solid Solutions for Solid State White Lighting", Optics Express, vol. 17, No. 25, pp. 22673-22679, Dec. 7, 2009.

(Continued)

*Primary Examiner* — Emily Le
*Assistant Examiner* — Lynne Edmondson
(74) *Attorney, Agent, or Firm* — Mary Louise Stanford

(57) ABSTRACT

Embodiments of the present techniques provide a related family of phosphors that may be used in lighting systems to generate blue or blue-green light. The phosphors include systems having a general formula of: $((Sr_{1-z}M_z)_{1-(x+w)}A_w Ce_x)_3 (Al_{1-y}Si_y)O_{4+y+3(x-w)}F_{1-y-3(x-w)}$ (I), wherein $0 < x \leq 0.10$, $0 \leq y \leq 0.5$, $0 \leq z \leq 0.5$, $0 \leq w \leq x$, A is Li, Na, K, Rb, or Ag or any combinations thereof, and M is Ca, Ba, Mg, Zn, or Sn or any combinations thereof. Advantageously, phosphors made accordingly to these formulations maintain emission intensity across a wide range of temperatures. The phosphors may be used in lighting systems, such as LEDs and fluorescent tubes, among others, to produce blue and blue/green light. Further, the phosphors may be used in blends with other phosphors, or in combined lighting systems, to produce white light suitable for illumination.

26 Claims, 6 Drawing Sheets

U.S. PATENT DOCUMENTS

| | | |
|---|---|---|
| 6,685,852 B2 | 2/2004 | Setlur et al. |
| 6,692,667 B2 | 2/2004 | Kyeng-Jung |
| 6,696,126 B1 | 2/2004 | Fischer et al. |
| 6,761,837 B2 | 7/2004 | Comanzo et al. |
| 6,809,471 B2 | 10/2004 | Setlur et al. |
| 6,844,671 B2 | 1/2005 | Setlur et al. |
| 6,867,536 B2 | 3/2005 | Srivastava et al. |
| 6,911,159 B2 | 6/2005 | Rogers et al. |
| 6,936,857 B2 | 8/2005 | Doxsee et al. |
| 6,965,193 B2 | 11/2005 | Srivastava et al. |
| 6,969,475 B2 | 11/2005 | Hyland, Jr. et al. |
| 7,022,263 B2 | 4/2006 | Comanzo et al. |
| 7,024,781 B1 | 4/2006 | Cowie |
| 7,026,755 B2 | 4/2006 | Setlur et al. |
| 7,077,978 B2 | 7/2006 | Setlur et al. |
| 7,077,980 B2 | 7/2006 | Ramachandran et al. |
| 7,088,038 B2 | 8/2006 | Srivastava et al. |
| 7,094,362 B2 | 8/2006 | Setlur et al. |
| 7,119,488 B2 | 10/2006 | Soules et al. |
| 7,224,000 B2 | 5/2007 | Aanegola et al. |
| 7,229,573 B2 | 6/2007 | Setlur et al. |
| 7,252,787 B2 | 8/2007 | Hancu et al. |
| 7,262,439 B2 | 8/2007 | Setlur et al. |
| 7,274,045 B2 | 9/2007 | Chandran et al. |
| 7,319,246 B2 | 1/2008 | Soules et al. |
| 7,321,191 B2 | 1/2008 | Setlur et al. |
| 7,327,078 B2 | 2/2008 | Setlur et al. |
| 7,329,371 B2 | 2/2008 | Setlur et al. |
| 7,358,542 B2 | 4/2008 | Radkov et al. |
| 7,391,148 B1 | 6/2008 | Setlur et al. |
| 2002/0158565 A1 | 10/2002 | Setlur et al. |
| 2003/0230739 A1 | 12/2003 | Comanzo et al. |
| 2004/0056990 A1 | 3/2004 | Setlur et al. |
| 2004/0113537 A1 | 6/2004 | Srivastava et al. |
| 2004/0113538 A1 | 6/2004 | Srivastava et al. |
| 2004/0113539 A1 | 6/2004 | Soules et al. |
| 2004/0150316 A1 | 8/2004 | Setlur et al. |
| 2004/0159846 A1 | 8/2004 | Doxsee et al. |
| 2004/0217693 A1 | 11/2004 | Duggal et al. |
| 2005/0001532 A1 | 1/2005 | Srivastava et al. |
| 2005/0029927 A1 | 2/2005 | Setlur et al. |
| 2005/0092968 A1 | 5/2005 | Setlur et al. |
| 2005/0093431 A1 | 5/2005 | Hancu et al. |
| 2005/0093442 A1 | 5/2005 | Setlur et al. |
| 2005/0168127 A1 | 8/2005 | Shei et al. |
| 2005/0179358 A1 | 8/2005 | Soules et al. |
| 2005/0199897 A1 | 9/2005 | Setlur et al. |
| 2005/0212397 A1 | 9/2005 | Murazaki et al. |
| 2005/0227388 A1 | 10/2005 | Setlur et al. |
| 2005/0230689 A1 | 10/2005 | Setlur et al. |
| 2005/0239227 A1 | 10/2005 | Aanegola et al. |
| 2005/0242327 A1 | 11/2005 | Ramachandran et al. |
| 2005/0253114 A1 | 11/2005 | Setlur et al. |
| 2005/0279969 A1 | 12/2005 | Comanzo et al. |
| 2006/0001036 A1 | 1/2006 | Jacob et al. |
| 2006/0022582 A1 | 2/2006 | Radkov |
| 2006/0071589 A1* | 4/2006 | Radkov .................. 313/487 |
| 2006/0091778 A1 | 5/2006 | Setlur et al. |
| 2006/0097245 A1 | 5/2006 | Aanegola et al. |
| 2006/0169986 A1 | 8/2006 | Radkov et al. |
| 2006/0169998 A1 | 8/2006 | Radkov et al. |
| 2006/0181192 A1 | 8/2006 | Radkov et al. |
| 2006/0222757 A1 | 10/2006 | Loureiro et al. |
| 2006/0231851 A1 | 10/2006 | Setlur et al. |
| 2006/0261309 A1 | 11/2006 | Li et al. |
| 2006/0284196 A1 | 12/2006 | Setlur et al. |
| 2007/0012013 A1 | 1/2007 | Strosser et al. |
| 2007/0029526 A1 | 2/2007 | Cheng et al. |
| 2007/0035813 A1 | 2/2007 | Roth et al. |
| 2007/0040502 A1 | 2/2007 | Setlur et al. |
| 2007/0045650 A1 | 3/2007 | Hancu et al. |
| 2007/0114561 A1 | 5/2007 | Comanzo et al. |
| 2007/0120135 A1 | 5/2007 | Soules et al. |
| 2007/0182309 A1* | 8/2007 | Wang et al. .................. 313/486 |
| 2007/0194695 A1 | 8/2007 | Yoon et al. |
| 2007/0205712 A1 | 9/2007 | Radkov et al. |
| 2007/0210283 A1 | 9/2007 | Marking et al. |
| 2007/0221938 A1 | 9/2007 | Radkov et al. |
| 2007/0235751 A1 | 10/2007 | Radkov et al. |
| 2007/0236956 A1 | 10/2007 | Kolodin et al. |
| 2007/0241657 A1 | 10/2007 | Radkov et al. |
| 2007/0241666 A1 | 10/2007 | Jang et al. |
| 2007/0258229 A1 | 11/2007 | Weaver et al. |
| 2007/0267976 A1 | 11/2007 | Bohler et al. |
| 2007/0273282 A1 | 11/2007 | Radkov et al. |
| 2007/0276606 A1 | 11/2007 | Radkov et al. |
| 2008/0054280 A1 | 3/2008 | Reginelli et al. |
| 2008/0111472 A1* | 5/2008 | Liu et al. .................. 313/503 |
| 2008/0124999 A1 | 5/2008 | Setlur et al. |
| 2008/0135860 A1 | 6/2008 | Setlur et al. |
| 2008/0136311 A1 | 6/2008 | Setlur et al. |
| 2008/0171229 A1 | 7/2008 | Comanzo et al. |
| 2008/0179567 A1 | 7/2008 | Comanzo et al. |
| 2009/0050918 A1 | 2/2009 | Zhuang et al. |
| 2009/0127508 A1* | 5/2009 | Kubel .................. 252/301.4 H |
| 2009/0174310 A1 | 7/2009 | Vogt et al. |
| 2009/0212314 A1 | 8/2009 | Im et al. |
| 2009/0302236 A1 | 12/2009 | Vogt et al. |

FOREIGN PATENT DOCUMENTS

| | | |
|---|---|---|
| EP | 0251550 B1 | 9/1991 |
| EP | 1878778 A1 | 10/2006 |
| JP | 200636943 A | 2/2006 |
| WO | WO2006/081803 A1 | 8/2006 |
| WO | WO2006/118389 A1 | 11/2006 |
| WO | WO2007/001117 A2 | 1/2007 |
| WO | WO2007/018569 A1 | 2/2007 |
| WO | WO2008/058462 A1 | 5/2008 |
| WO | WO2008/060586 A2 | 5/2008 |
| WO | WO2008/060836 A2 | 5/2008 |

OTHER PUBLICATIONS

Im, Won Bin, et al.; "A yellow-emitting $Ce^{3+}$ phosphor, $La_{1-x}Ce_xSr_2AlO_5$, for white light-emitting diodes"; Appl. Phys. Lett 93, 091905, 1-3 (2008).

Prodjosantoso, A. K. et al.; "Cation and anion ordering in the layered oxyfluorides $Sr_{3-x}A_xAlO_4F$ (A=Ba, Ca)"; J. Solid State Chem. 172, 89-94 (2003).

Vogt, T., et al.; "$Sr_3MO_4F$ (M=Al, Ga)—A New Family of Ordered Oxyfluorides"; Journal of Solid State Chem. 144, 228-231 (1999).

Im, Won Bin, et al.; "$La_{1-x-0.025}Ce_{0.025}Sr_{2+x}Al_{1-x}Si_xO5$ solid solutions as tunable yellow phosphors for solid state white lighting"; Journal of Materials Chemistry; J. Mater. Chem., 2009, 19, pp. 1325-1330.

European Search Report dated Oct. 12, 2010.

* cited by examiner

BLUE-GREEN AND GREEN PHOSPHORS FOR LIGHTING APPLICATIONS

STATEMENT REGARDING FEDERALLY SPONSORED RESEARCH & DEVELOPMENT

This invention was made with Government support under contract number DE-FC26-06NT42934 awarded by the Department of Energy. The Government has certain rights in the invention.

BACKGROUND

The present techniques generally relate to novel phosphor compositions. More specifically, the present techniques describe phosphors that retain a substantial portion of their room temperature quantum efficiency at elevated temperatures. The phosphors may be used in light emitting diodes, Hg-based fluorescent lamps, gas discharge lamps, in UV, violet and/or blue lasers, as well as other white or colored light sources for different applications.

A phosphor is a luminescent material that absorbs radiation energy in one portion of the electromagnetic spectrum and emits energy in another portion of the electromagnetic spectrum. One important class of phosphors includes crystalline inorganic compounds of very high chemical purity and of controlled composition, to which small quantities of other elements, called "activators," have been added for fluorescent emission. With the right combination of activators and inorganic compounds, the color of the emission of these crystalline phosphors may be controlled. Most useful phosphors emit radiation in the visible portion of the electromagnetic spectrum in response to excitation by electromagnetic energy outside the visible range. For example, phosphors have been used in mercury vapor discharge lamps to convert the ultraviolet (UV) radiation emitted by the excited mercury to visible light. Further, phosphors may be used in light emitting diodes (LEDs) to generate colors that may generally not be obtained from the LED chip itself.

Light emitting diodes (LEDs) are semiconductor light emitters that may be used as replacements for other light sources, such as incandescent lamps. They are particularly useful as display lights, warning lights and indicating lights or in other applications where colored light is desired. The color of light produced by an LED is dependent on the type of semiconductor material used in its manufacture.

Colored semiconductor light emitting devices, including light emitting diodes and semiconductor lasers (which are both generally referred to herein as LEDs), have been produced from Group III-V alloys such as gallium nitride (GaN). To form the LEDs, layers of the alloys are typically deposited epitaxially on a substrate, such as silicon carbide or sapphire, and may be doped with a variety of n- and p-type dopants to improve properties, such as light emission efficiency. With reference to the GaN-based LEDs, light is generally emitted in the UV to green range of the electromagnetic spectrum. Until quite recently, LEDs have not been suitable for lighting uses where a bright white light is needed, due to the inherent color of the light produced by the LED.

However, techniques have been developed for converting the light emitted from LEDs to useful light for illumination and other purposes. In one technique, the LED may be coated or covered with a phosphor layer. By interposing a phosphor excited by the radiation generated by the LED, light of a different wavelength, such as in the visible range of the spectrum, may be generated. Colored LEDs are often used in toys, indicator lights and other devices. Manufacturers are continuously looking for new colored phosphors for use in such LEDs to produce custom colors and higher luminosity.

The production of light from LEDs and other light sources generates heat as a byproduct. Phosphors may respond to this heat with a decrease in quantum efficiency, which is the number of photons emitted by the phosphor versus the number of photons absorbed by the phosphor. Accordingly, as the quantum efficiency of different phosphors may change at different rates as temperature increases, the light emitted by the device may dim or the color may shift as the device enters steady state operation.

Thus, there is a continued demand for phosphor compositions that may be used as components, individually or as part of a phosphor blend, in the manufacture of LEDs and other light sources. Such phosphor compositions should allow a wider array of light sources with desirable properties including good color quality (CRI>80), a large range of color temperatures, and a relative insensitivity to temperature changes.

BRIEF DESCRIPTION

An embodiment of the present techniques provides a lighting apparatus that includes a light source emitting radiation with a peak at from about 250 nm to about 550 nm and a phosphor composition configured to be radiationally coupled to the light source. The phosphor composition comprises a phosphor having a general formula of $((Sr_{1-z}M_z)_{1-(x+w)}A_wCe_x)_3(Al_{1-y}Si_y)O_{4+y+3(x-w)}F_{1-y-3(x-w)}$, wherein $0<x\leq0.10$ and $0\leq y\leq0.5$, $0\leq w\leq x$, A is Li, Na, K, Rb, or any combinations thereof, and M is Ca, Ba, Mg, Zn, or any combinations thereof.

Another embodiment provides a phosphor having a general formula of $((Sr_{1-z}M_z)_{1-(x+w)}A_wCe_x)_3(Al_{1-y}Si_y)O_{4+y+3(x-w)}F_{1-y-3(x-w)}$, wherein $0<x\leq0.10$ and $0\leq y\leq0.5$, $0\leq w\leq x$, A is Li, Na, K, Rb, or any combinations thereof, and M is Ca, Ba, Mg, Zn, or any combinations thereof.

A third embodiment provides a phosphor blend of a first phosphor having a general formula of $((Sr_{1-z}M_z)_{1-(x+w)}A_wCe_x)_3(Al_{1-y}Si_y)O_{4+y+3(x-w)}F_{1-y-3(x-w)}$, wherein $0<x\leq0.10$ and $0\leq y\leq0.5$, $0\leq z\leq0.5$, $0\leq w\leq x$, A is Li, Na, K, Rb, or any combinations thereof, and M is Ca, Ba, Mg, Zn, or any combinations thereof. At least one additional phosphor is blended with the first phosphor and the resulting phosphor blend is capable of emitting light suitable for use either alone or in combination with radiation emitted by a light source radiationally coupled to the phosphor.

A last embodiment provides a method for producing a phosphor, the method includes providing amounts of oxygen-containing compounds of cerium silicon, and at least one alkaline-earth metal selected from the group consisting of Sr, Ba, Ca, and combinations thereof. The oxygen-containing compounds are mixed together and with a fluoride-containing compound to form a mixture. The mixture is fixed at a temperature between about 600° C. and about 1400° C. under a reducing atmosphere for a sufficient period of time to convert the mixture to a phosphor comprising a general formula of $((Sr_{1-z}M_z)_{1-(x+w)}A_wCe_x)_3(Al_{1-y}Si_y)O_{4+y+3(x-w)}F_{1-y-3(x-w)}$, wherein $0<x\leq0.10$ and $0\leq y\leq0.5$, $0\leq z\leq0.6$, $0\leq w\leq x$, A is Li, Na, K, Rb, or any combinations thereof, and M is Ca, Ba, Mg, Zn, or any combinations thereof.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
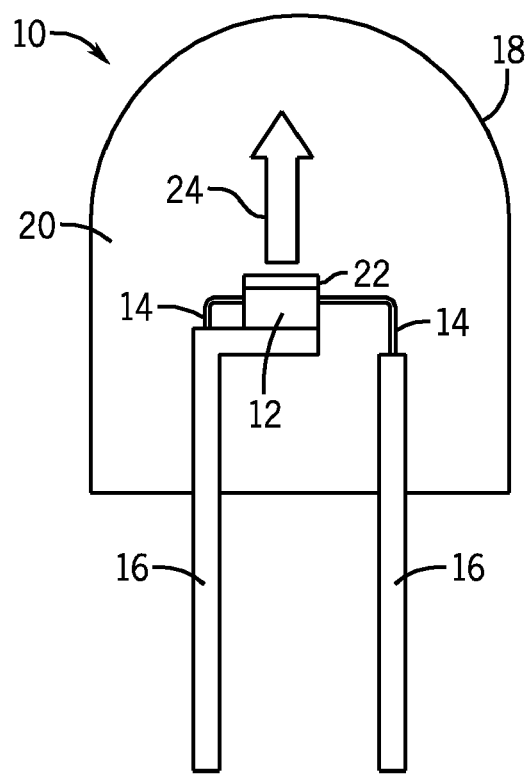
FIG. 1 is a schematic cross-sectional view of an illumination system in accordance with an embodiment.

Embodiments of the present techniques provide phosphors that may be used in lighting systems to generate blue or blue-green light. The phosphors include systems having a general formula of: $((Sr_{1-z}M_z)_{1-(x+w)}A_wCe_x)_3(Al_{1-y}Si_y)O_{4+y+3(x-w)}F_{1-y-3(x-w)}$ (I), wherein $0<x\leq0.10$ and $0\leq y\leq0.5$, $0\leq z\leq0.5$, $0\leq w\leq x$, A is Li, Na, K, Rb, or any combinations thereof, and M is Ca, Ba, Mg, Zn, or any combinations thereof. Advantageously, phosphors made accordingly to these formulations may maintain emission intensity (quantum efficiency) across a wide range of temperatures. The phosphors may be used in lighting systems, such as LEDs and fluorescent tubes, among others, to produce blue and blue/green light. Further, other embodiments provide phosphor blends that may be used to generate other colors, such as white light suitable for general illumination and other purposes.

In general formula I, shown above, the addition of the $Ce^{3+}$ and $Si^{4+}$ ions is charge balanced, resulting in a zero charge system, by using both an addition of an alkali metal and a modification of the amount of oxide and fluoride ions in the formulation. However, if the addition of $Ce^{3+}$ ion is charge balanced only by including the alkali metal, such as Li, Na, K, or Rb, Ag, Cu the formula above reduces to a general formula of $((Sr_{1-y}M_y)_{1-2x}A_xCe_x)_3AlO_4F$ (II), wherein $0<x\leq0.10$, $0\leq y\leq0.5$, A is Li, Na, K, Rb, or any combinations thereof, and M is Ca, Ba, Mg, Zn, or any combinations thereof. Alternatively, if the addition of the $Ce^{3+}$ ion is charge balanced by adjusting the amount of oxide and fluoride ions in the formula, the resulting formula is $((Sr_{1-z}M_z)_{1-x}Ce_x)_3(Al_{1-y}Si_y)O_{4+y+3x}F_{1-y-3x}$ (III), wherein $0<x\leq0.10$ and $0\leq y\leq0.5$, $0\leq z\leq0.5$, and M is Ca, Ba, Mg, Zn, or any combinations thereof.

In any of the phosphors of general formulas I-III, a portion or all of the $Al^{3+}$ may be replaced with other equivalently charged ions. For example, $Al^{3+}$ may be partially or totally replaced with $B^{3+}$, $Ga^{3+}$, $Sc^{3+}$, or $Y^{3+}$, among others, or any combinations thereof. This may allow for tuning the spectrum obtained from the phosphors. Further, in addition to $Ce^{3+}$ the phosphors above may be additionally doped with other activator ions. Such ions may include Pr, Sm, Eu, Tb, Dy, Tm, Er, Ho, Nd, Bi, Yb, Pb, Yb, Mn, Ag, or Cu or any combinations thereof.

The phosphors of the present techniques have the advantage of a reduced quenching of the luminescence at high temperatures, for example, having a quantum efficiency at about 150° C. that is at least about 80% of the quantum efficiency measured at ambient temperature, such as between about 15° C. and about 25° C. In contrast, many current phosphors have a quantum efficiency at 150° C. that is only about 60% of the quantum efficiency at ambient temperature. Accordingly, the present phosphors maintain their emission intensity across a large range of temperatures, which may mitigate losses of intensity or lamp color shifts as the temperature of a lighting system increases during use.

Production of the Phosphors of the Present Techniques

The phosphors disclosed above, and other phosphors used to make blends with these phosphors, may be produced by mixing powders of oxygen-containing compounds of the relevant metals and a fluoride species, and then firing the mixture under a reducing atmosphere. For example, the exemplary phosphor $(Sr_{0.75}Ca_{0.23}Na_{0.01}Ce_{0.01})(Al_{0.75}Si_{0.25})O_{4.25}F_{0.75}$, discussed further in the examples below, may be produced by mixing the appropriate amounts of oxygen-containing compounds of strontium, calcium, sodium, cerium, aluminum, and silicon with the appropriate amount of a fluoride containing compound, and then firing the mixture under a reducing atmosphere. After firing, the phosphor may be ball milled, or otherwise ground, to break up any conglomerates that may have formed during the firing procedure. The grinding may be performed after all firing steps are completed, or may be interspersed with additional firing steps.

Non-limiting examples of suitable oxygen-containing compounds include oxides, hydroxides, alkoxides, carbonates, nitrates, aluminates, silicates, citrates, oxalates, carboxylates, tartarates, stearates, nitrites, peroxides and combinations of these compounds. In embodiments containing carboxylates, the carboxylates used may generally have from one to five carbon atoms, such as formates, ethanoates, proprionates, butyrates, and pentanoates, although carboxylates having larger numbers of carbon atoms may be used.

The mixture of starting materials for producing the phosphor may also comprise a flux, such as boric acid, lithium tetraborate, an alkali carbonate, an alkali phosphate, or a mixture of these compounds. Fluoride and other halide compounds may also perform as a flux. The flux may lower the firing temperature and/or time for the phosphor. If a flux is used, it may be desirable to wash the final phosphor product with a suitable solvent to remove any residual soluble impurities that may have originated from the flux.

The oxygen containing compounds may be mixed together by any mechanical method. Such methods may include stirring or blending the powders in a high speed blender or a ribbon blender, or combining and pulverizing the powders in a ball mill, hammer mill, or jet mill. Any number of other techniques may also suitable for making a well-blended mixture of powders. If the mixture is wet, it may be dried first before being fired. The drying may be carried out at ambient atmosphere or under a vacuum.

Generally, the mixture of oxide and fluoride powders is fired in a reducing atmosphere at a temperature between about 600° C. and about 1400° C., or between about 750° C. and about 1300° C. for a time sufficient to convert the mixture to the phosphor. The firing may be conducted in a batch or continuous process. The firing time required may range from about one to twenty hours, depending on the amount of the mixture being fired, the extent of contact between the solid and the gas of the atmosphere, and the degree of mixing while the mixture is fired or heated. The mixture may rapidly be brought to and held at the final temperature, or the mixture may be heated to the final temperature at a lower rate such as from about 2° C./minute to about 200° C./minute. Generally, the temperature may be raised to the final temperature at rates of about 2° C./minute to about 100° C./minute.

The firing is performed under a reducing atmosphere, which may include such reagents as hydrogen, carbon monoxide, ammonia, hydrazine, or a mixture of these reagents with an inert gas such as nitrogen, helium, argon, etc. For example, a mixture of hydrogen and nitrogen containing hydrogen in an amount from about 0.5 volume percent to about 10 volume percent, or from about 0.75 volume percent to about 2 volume percent, may be used as a reducing gas. Alternately, the reducing gas may be carbon monoxide, generated in situ in the firing chamber by the reaction between residual oxygen and carbon particles placed in the firing chamber. The reducing atmosphere may also be generated by the decomposition of ammonia or hydrazine in the firing chamber. After firing, the phosphor may be ground in an organic solvent slurry to break up aggregates that may have formed during firing.

Although the process described above uses a single firing step, firing steps may be alternated with grinding steps to assist in the formation of small particles. Those skilled in the art will recognize that the precise conditions needed for the synthesis of a particular phosphor composition will depend on the phosphor chosen and are within the ambit of the conditions above.

Further, the phosphors discussed above may be made into solid solutions with phosphors based on compositions with similar structures. One method to do this could be by making each of the individual phosphors, and then firing a raw blend of the two, or more, phosphors together. For example, phosphors may be made that contain solid solutions of phosphors having the general formulas I-III with compositions having the general formulas: $(Ba,Sr,Ca)_3SiO_5$, $Sr_2(Gd,La,Y)AlO_5$, $(La,Gd,Y)_3SiO_4N$, or any combinations thereof. Any of the dopants discussed above may be used in these phosphors to obtain the desired emission spectrum.

In addition to the synthesis procedures discussed above, many of the phosphors that may be used in the blends described below may be commercially available. For example, the phosphor $(Ba,Sr,Ca)_5(PO_4)_3(Cl,F,Br,OH):Eu^{2+}$ (SECA), used in blend calculations with the presently disclosed phosphors, may be commercially available.

It should be noted that various phosphors are described herein in which different elements enclosed in parentheses and separated by commas, such as in the case of $(Ba,Sr,Ca)_2SiO_4:Eu^{2+}$. As understood by those skilled in the art, this type of notation means that the phosphor can include any or all of those specified elements in the formulation in any ratio. That is, this type of notation for the above phosphor, for example, has the same meaning as $(Ba_aSr_bCa_{1-a-b})_2SiO_4:Eu^{2+}$, where a and b can vary from 0 to 1, including the values of 0 and 1.

Phosphor Blends

The phosphors of the present techniques may be blended with other phosphors to create other colors, such as white light for illumination applications. Other blends may be used to create different colors, such as yellow, green, red, etc. Lighting systems using the phosphors of the present techniques to generate blue or blue/green light may be combined with lighting systems using other phosphors that generate red light to form a white light source. For example, in contemplated embodiments, complex fluorides doped with $Mn^{4+}$ (e.g. $(Na,K,Rb,Cs,NH_4)_2[(Ti,Ge,Sn,Si,Zr,Hf)F_6]:Mn^{4+}$ and the like), which emit red light, may blended with the phosphors of the present techniques to obtain white light. A non-limiting example of a complex fluoride doped with $Mn^{4+}$ is $K_2[SiF_6]:Mn^{4+}$ (PFS) used in some illustrative blend examples further below. Other non-limiting examples of phosphors that may be used in blends with the phosphors of the present techniques include: Yellow $(Ba,Sr,Ca)_5(PO_4)_3(Cl,F,Br,OH):Eu^{2+},Mn^{2+}$; $(Ba,Sr,Ca)BPO_5:Eu^{2+},Mn^{2+}$; $(Sr,Ca)_{10}(PO_4)_6*xB_2O_3:Eu^{2+}$ (wherein $0<x\leq1$); $Sr_2Si_3O_8*2SrCl_2:Eu^{2+}$; $(Ca,Sr,Ba)_3MgSi_2O_8:Eu^{2+},Mn^{2+}$; $BaAl_8O_{13}:Eu^{2+}$; $2SrO*0.84P_2O_5*0.16B_2O_3:Eu^{2+}$; $(Ba,Sr,Ca)MgAl_{10}O_{17}:Eu^{2+}Mn^{2+}$; $(Ba,Sr,Ca)Al_2O_4:Eu^{2+}$; $(Y,Gd,Lu,Sc,La)BO_3:Ce^{3+},Tb^{3+}$; $(Ba,Sr,Ca)_2Si_{1-x}O_{4-2x}:Eu^{2+}$ (wherein $0\leq x\leq0.2$) (SASI); $(Ba,Sr,Ca)_2(Mg,Zn)Si_2O_7:Eu^{2+}$; $(Sr,Ca,Ba)(Al,Ga,In)_2S_4:Eu^{2+}$; $(Y,Gd,Tb,La,Sm,Pr,Lu)_3(Sc,Al,Ga)_{5-a}O_{12-3/2a}:Ce^{3+}$ (wherein $0\leq a\leq0.5$); $(Lu,Sc,Y,Tb)_{2-x-y}Ce_yCa_{1+x}Li_zMg_{2-z}P_z(Si,Ge)_{3-z}O_{12-x/2}$ (wherein $0.5\leq x\leq1$, $0<y\leq0.1$, and $0\leq z\leq0.2$); $(Ca,Ba,Sr)Si_2O_2N_2:Eu^{2+},Ce^{3+}$; $(Ca,Sr)_8(Mg,Zn)(SiO_4)_4Cl_2:Eu^{2+},Mn^{2+}$; $Na_2Gd_2B_2O_7:Ce^{3+},Tb^{3+}$; $(Sr,Ca,Ba,Mg,Zn)_2P_2O_7:Eu^{2+},Mn^{2+}$; $(Gd,Y,Lu,La)_2O_3:Eu^{3+},Bi^{3+}$; $(Gd,Y,Lu,La)_2O_2S:Eu^{3+},Bi^{3+}$; $(Gd,Y,Lu,La)VO_4:Eu^{3+},Bi^{3+}$; $(Ca,Sr)S:Eu^{2+},Ce^{3+}$:$ZnS:Cu^+,Cl^-$; $ZnS:Cu^+,Al^{3+}$; $ZnS:Ag^+,Cl^-$; $ZnS:Ag^+,Al^{3+}$; $SrY_2S_4:Eu^{2+}$; $CaLa_2S_4:Ce^{3+}$; $(Ba,Sr,Ca)MgP_2O_7:Eu^{2+},Mn^{2+}$; $(Y,Lu)_2WO_6:Eu^{3+},Mo^{6+}$; $(Ba,Sr,Ca)_xSi_yN_z:Eu^{2+},Ce^{3+}$ (wherein $2x+4y=3z$); $Ca_3(SiO_4)Cl_2:Eu^{2+}$; $(Y,Lu,Gd)_{2-x}Ca_xSi_4N_{6+x}C_{1-x}:Ce^{3+}$, (wherein $0\leq x\leq0.5$); $(Lu,Ca,Li,Mg,Y)$alpha-$SiAlON:Eu^{2+},Ce^{3+}$; $3.5MgO*0.5MgF_2*GeO_2:Mn^{4+}$ (Mg-fluorogermanate); $Ca_{1-x-y}Ce_xEu_yAl_{1+x}Si_{1-x}N_3$, (wherein $0<x\leq0.2$, $0\leq y\leq0.2$); $Ca_{1-x-y}Ce_xEu_yAl_{1-x}(Mg,Zn)SiN_3$, (where $0<x\leq0.2$, $0\leq y\leq0.2$); $Ca_{1-2x-y}Ce_x(Li,Na)_xEu_yAlSiN_3$, (where $0\leq x\leq0.2$, $0\leq y\leq0.2$, $x+y>0$); $Ca_{1-x-y-z}Ce_x(Li,Na)_yEu_zAl_{1+x-y}Si_{1-x+y}N_3$, (where $0\leq x\leq0.2$, $0<y\leq0.4$, $0\leq z\leq0.2$); or any combinations thereof. Each of the general formulas listed herein is independent of every other general formula listed. Specifically, x, y, z, and other variables that may be used as numeric placeholders in a formula are not related to any usage of x, y, z and other variables that may be found in other formulas or compositions.

The phosphors listed above are not intended to be limiting. Any other phosphors, commercial and non-commercial, that form non-reactive blends with the phosphors of the present techniques may be used in blends and are to be considered to be within the scope of the present techniques.

For purposes of the present techniques, it should be understood that when a phosphor formulation indicates the presence of two or more dopant ions (i.e. those ions following the colon in the above compositions), this is to mean that the phosphor has at least one (but not necessarily all) of those dopant ions within the material. Thus, as understood by those skilled in the art, this type of notation means that the phosphor can include any or all of those specified ions as dopants in the formulation.

In addition to phosphor blends, a combination of the light from a light source and the light from a phosphor or phosphor blend may be used to produce white light. For example, a white LED may be based on a blue emitting InGaN chip. The blue emitting chip may be coated with a phosphor or a phosphor blend to convert some of the blue radiation to a complementary color, e.g. a yellow-green emission.

The light emitted from the lighting system may be characterized using any number of standard measurements. This characterization may normalize the data and make the comparison of light emitted by different lighting systems easier to determine. For example, the total of the light from a phosphor and from an LED chip provides a color point with corresponding color coordinates (x and y) in the CIE 1931 chromaticity diagram and correlated color temperature (CCT), and its spectral distribution provides a color rendering capability, measured by the color rendering index (CRI). The CRI is commonly defined as a mean value for 8 standard color samples (R1-8), usually referred to as the general Color Rendering Index, or $R_a$. A higher value for CRI produces a more "natural" appearance for illuminated objects. By definition, an incandescent light has a CRI of 100, while a typical compact fluorescent light may have a CRI of about 82. Further, the luminosity, or apparent brightness, of a source may also be determined from the spectrum of the emitted light. The luminosity is measured as lm/W-opt, which represents the number of lumens that 1 watt of light having a particular spectral distribution would represent. A higher lm/W-opt value indicates that a particular source would appear brighter to an observer.

As the light emitted from combined lighting system components is generally additive, the final spectra of phosphor blends and/or lighting systems may be predicted. For example, the amount of light emitted from each phosphor in a blend may be proportional to the amount of that phosphor within the blend. Accordingly, the emission spectrum resulting from the blend can be modeled, and the spectral properties, e.g., the CCT, the CRI, color axes (x and y), and lm/W-opt may be calculated from the predicted emission spectrum. Various blends that may be made using the phosphors of the present techniques are discussed in the examples below.

Lighting Systems Using the Phosphors of the Present Techniques

Turning now to the figures, FIG. 1 illustrates an exemplary LED based light 10 that may incorporate the phosphors and phosphor blends of the present techniques. The LED based light 10 includes a semiconductor UV or visible radiation source, such as a light emitting diode (LED) chip 12. Power leads 14 that are electrically attached to the LED chip 12 provide the current that causes the LED chip 12 to emit radiation. The leads 14 may include thin wires supported on thicker package leads 16. Alternatively, the package leads 16 may be directly attached to the LED chip 12.

The LED based light 10 may include any LED chip 12 that is capable of producing visible or UV light and which may produce colored or white light when its emitted radiation is blended with light emitted by a phosphor composition. The peak emission of the LED chip 12 may be selected at least in part on the identity of the phosphors in the blend, e.g., selected to match the maximum absorbance of the phosphors. For example, the emitted light from the chip 12 may peak in the range from about 250 nm to about 550 nm. Generally, however, the emission of the LED will be in the near UV to blue region and have a peak wavelength in the range from about 350 to about 500 nm.

The LED chip 12 is typically a semiconductor that has been doped with various impurities and may include a semiconductor diode based on any suitable III-V, II-VI or IV-IV semiconductor layers. In some embodiments, the LED chip 12 may contain at least one semiconductor layer comprising GaN, ZnO or SiC. In other embodiments, the LED chip 12 may comprise a nitride compound semiconductor represented by the formula $In_jGa_kAl_lN$ (where $0 \leq j$; $0 \leq k$; $0 \leq l$ and $j+k+l=1$) having a peak emission wavelength greater than about 250 nm and less than about 550 nm. Such LED chips 12 are known in the art. Although the radiation source is described as an LED, the term is meant to encompass all semiconductor radiation sources including semiconductor laser diodes, among others.

In addition to inorganic semiconductors, the LED chip 12 may be replaced by an organic light emissive structure or other radiation source. Other types of light sources may be used as a radiation source in place of LEDs, such as the gas discharge tubes discussed with respect to FIG. 5, below.

The LED chip 12 may be encapsulated within a shell 18, which encloses the LED chip and an encapsulant material 20. The shell 18 may be glass or plastic. The encapsulant 20 may be an epoxy, plastic, low temperature glass, polymer, thermoplastic, thermoset material, resin, silicone, silicone epoxy, or any other type of LED encapsulating material. Further, the encapsulant 20 may be a spin-on glass or some other high index of refraction material. Typically, the encapsulant material 20 is an epoxy or a polymer material, such as silicone. The shell 18 and the encapsulant 20 are transparent, i.e., substantially optically transmissive, with respect to the wavelength of light produced by the LED chip 12 and a phosphor material 22, such as the phosphors and phosphor blends of the present techniques. However, if the LED chip 12 emits light that is within the UV spectrum, the encapsulant 20 may only be transparent to light from the phosphor material 22. The LED based light 10 may include an encapsulant 20 without an outer shell 18. In this application, the LED chip 12 may be supported by the package leads 16, or by a pedestal (not shown) mounted to the package leads 16.

The structure of the lighting system further includes a phosphor material 22 radiationally coupled to the LED chip 12. Radiationally coupled means that the elements are associated with each other so radiation from one is transmitted to the other. Accordingly, a phosphor that is radiationally coupled to the LED chip 12 may absorb radiation, such as blue or UV light, emitted by the LED chip 12, and emit longer wavelengths, such as blue, blue-green, red, or other colors of light.

This phosphor material 22 may be deposited on the LED chip 12 by any appropriate method. For example, a solvent based suspension of a phosphor or phosphors can be formed, and applied as a layer onto the surface of the LED chip 12. In a contemplated embodiment, a silicone slurry in which the phosphor particles are randomly suspended may be placed over the LED chip 12. Thus, the phosphor material 22 may be coated over or directly on the light emitting surface of the LED chip 12 by coating and drying the phosphor suspension over the LED chip 12. As the shell 18 and the encapsulant 20 will generally be transparent, the emitted light 24 from the LED chip 12 and phosphor material 22 will be transmitted through those elements.

Figure 2:
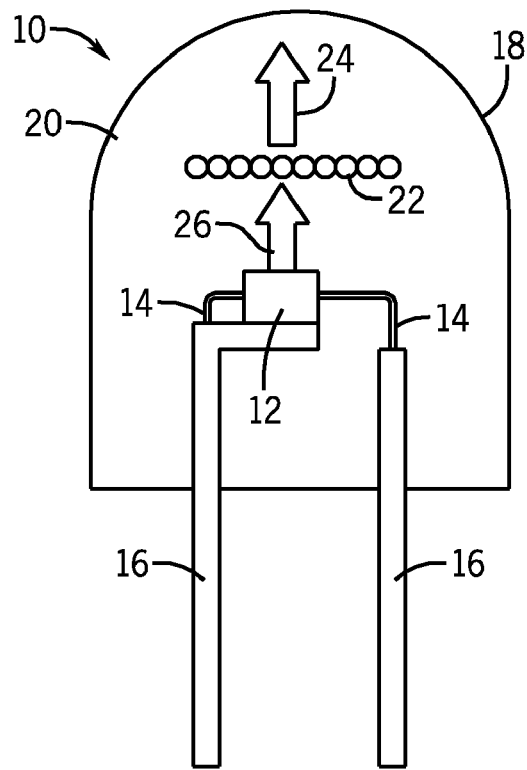
FIG. 2 is a schematic cross-sectional view of another illumination system in accordance with an embodiment.

A second structure that may incorporate the phosphors and phosphor blends of the present techniques is illustrated in the cross section of FIG. 2. The structure in FIG. 2 is similar to that of FIG. 1, except that the phosphor material 22 is interspersed within the encapsulant 20, instead of being formed directly on the LED chip 12. The phosphor material 22 may be interspersed within a single region of the encapsulant 20 or throughout the entire volume of the encapsulant 20. Radiation 26 emitted by the LED chip 12 mixes with the light emitted by the phosphor material 22, and the mixed light may be visible through the transparent encapsulant 20, appearing as emitted light 24.

The encapsulant 20 with the interspersed phosphor material 22 may be formed by any number of suitable plastics processing techniques. For example, the phosphor material 22 may be combined with a polymer precursor, molded around the LED chip 12, and then cured to form the solid encapsulant 20 with the interspersed phosphor material 22. In another technique, the phosphor material 22 may be blended into a molten encapsulant 20, such as a polycarbonate, formed around the LED chip 12, and allowed to cool. Processing techniques for molding plastics that may be used, such as injection molding, are known in the art.

Figure 3:
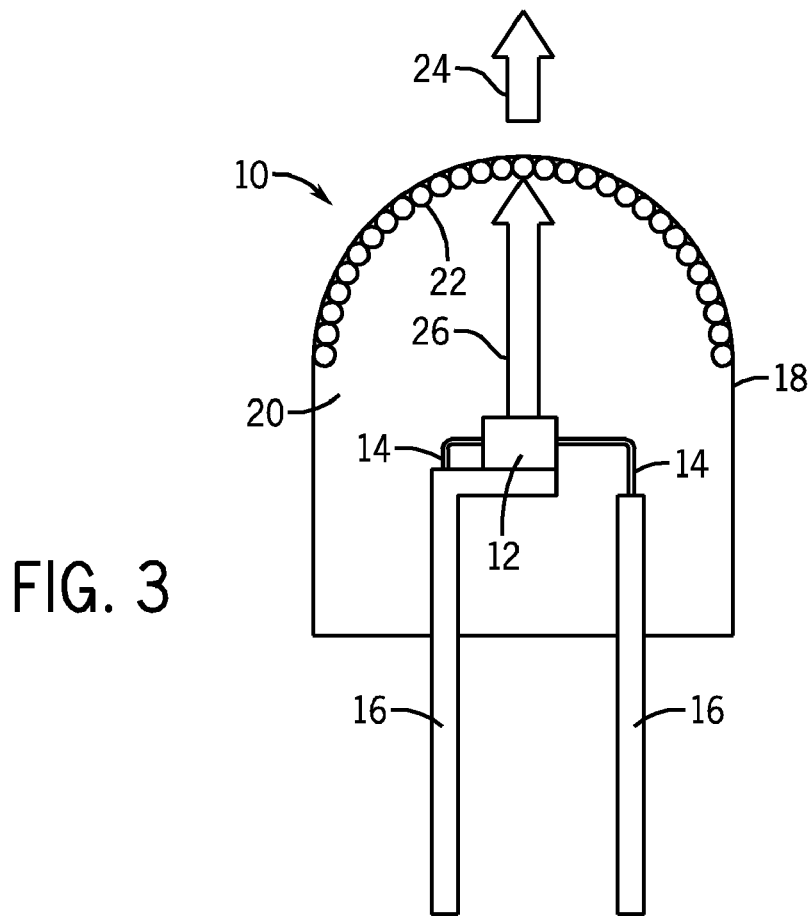
FIG. 3 is a schematic cross-sectional view of a third illumination system in accordance with an embodiment.

FIG. 3 is a cross section of another structure that may incorporate the phosphor material 22 of the present techniques. The structure shown in FIG. 3 is similar to that of FIG. 1, except that the phosphor material 22 may be coated onto a surface of the shell 18, instead of being formed over the LED chip 12. Generally, the phosphor material 22 is coated on the inside surface of the shell 18, although the phosphor material 22 may be coated on the outside surface of the shell 18, if desired. The phosphor material 22 may be coated on the entire surface of the shell 18 or only a top portion of the surface of the shell 18. The radiation 26 emitted by the LED chip 12 mixes with the light emitted by the phosphor material 22, and the mixed light appears as emitted light 24.

The structures discussed with respect to FIGS. 1-3 may be combined, with the phosphor located in any two or all three locations or in any other suitable location, such as separately from the shell or integrated into the LED. Further, different phosphors may be used in different parts of the structure. For example, a phosphor according to formula I may be incorporated into the encapsulant 20, while a complementary phosphor, such as from the list of phosphors discussed previously, may be coated onto the shell 18. This may provide a convenient technique for combining complementary colors, for example, to form a white light source.

In any of the above structures, the LED based light 10 may also include a plurality of particles (not shown) to scatter or diffuse the emitted light. These particles would generally be embedded in the encapsulant 20. The scattering particles may include, for example, particles made from $Al_2O_3$ (alumina) or $TiO_2$. The scattering particles may effectively scatter the light emitted from the LED chip 12, and are generally selected to have a negligible amount of absorption.

Figure 4:
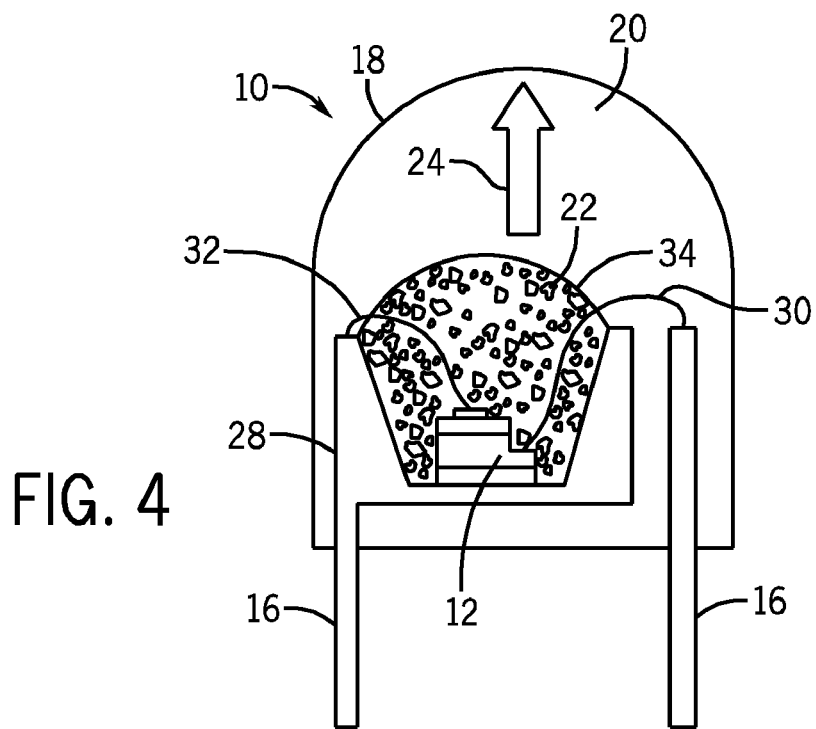
FIG. 4 is a schematic cross-sectional view of a fourth illumination system in accordance with an embodiment.

In addition to the structures above, the LED chip 12 may be mounted in a reflective cup 28, as illustrated by the cross section shown in FIG. 4. The reflective cup 28 may be made from or coated with a reflective material, such as alumina, titania, or other dielectric powder known in the art. Generally, the reflective surface may be made from $Al_2O_3$. The remainder of the structure of the LED based light 10 of FIG. 4 is the same as that of the previous figure, and includes two leads 16, a conducting wire 30 electrically connecting the LED chip 12 with one of the leads 16, and an encapsulant 20. The reflective cup 28 may conduct current to energize the LED chip 12, or a second conducting wire 32 may be used. The phosphor material 22 may be dispersed throughout the encapsulant 20, as described above, or may be dispersed in a smaller transparent casing 34 formed within the reflective cup 28. Generally, the transparent casing 34 may be made from the same materials as the encapsulant 20. The use of the transparent casing 34 within the encapsulant 20 may be advantageous in that a smaller amount of the phosphor material 22 may be required than if the phosphor were to be dispersed throughout the encapsulant 20. The encapsulant 20 may contain particles (not shown) of a light scattering material, as previously described to diffuse the emitted light 24.

Although the embodiments described above are focused on an LED based light 10, the phosphors and phosphor blends of the present techniques may be used with other radiation sources. For example, the radiation source may be a gas discharge device. Examples of gas discharge devices include low-, medium-, and high-pressure mercury gas discharge lamps.

Figure 5:
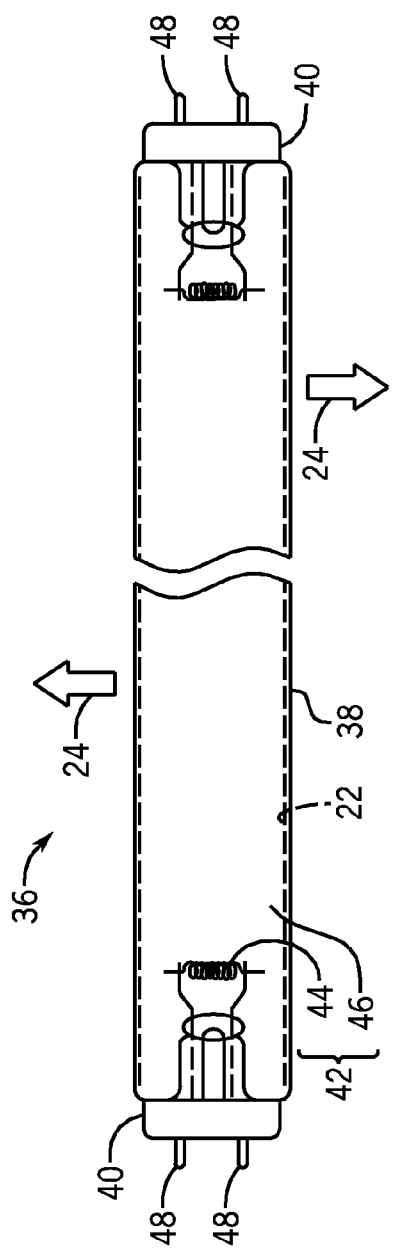
FIG. 5 is a schematic cross-sectional view of a fifth illumination system in accordance with an embodiment.

FIG. 5 is a perspective view of a light source 36 based on a gas discharge device, such as a fluorescent lamp, which may use the phosphors and phosphor blends of the present techniques. The light source 36 may include an evacuated sealed housing 38, an excitation system 42 for generating UV radiation and located within the housing 38, and a phosphor material 22 disposed within the housing 38. End caps 40 are attached to either end of the housing 30 to seal the housing 38.

In a typical fluorescent lamp, the phosphor material 22, such as the phosphors and phosphor blends of the present techniques, may be disposed on an inner surface of the housing 38. The excitation system 42 for generating the UV radiation may include an electron generator 44 for generating high-energy electrons and a fill gas 46 configured to absorb the energy of the high-energy electrons and emit UV light. For example, the fill gas 46 may include mercury vapor, which absorbs energy of the high-energy electrons and emits UV light. In addition to mercury vapor, the fill gas 46 may include a noble gas such as argon, krypton, and the like. The electron generator 44 may be a filament of a metal having a low work function (for example, less than 4.5 eV), such as tungsten, or a filament coated with alkaline earth metal oxides. Pins 48 may be provided to supply electrical power to the electron generator 44. The filament is coupled to a high-voltage source to generate electrons from the surface thereof.

As for the LED based light 10, the phosphor material 22 is radiationally coupled to the UV light from the excitation system 42. As previously described, radiationally coupled means that the phosphor material 22 is associated with the excitation system 42 so that radiation from the UV light from the excitation system 42 is transmitted to the phosphor material 22. Thus, a phosphor that is radiationally coupled to the excitation system 42 may absorb radiation, such as the UV light emitted by the excitation system 42, and, in response, emit longer wavelengths, such as blue, blue-green, green, yellow, or red light. The longer wavelength of light may be visible as emitted light 24 transmitted through the housing 38. The housing 38 is generally made of a transparent material such as glass or quartz. Glass is commonly used as the housing 38 in fluorescent lamps, as the transmission spectrum of the glass may block a substantial portion of the "short wave" UV radiation, i.e., light having a wavelength of less than about 300 nm.

As described previously, the phosphor material 22 may be a blend of phosphors configured to produce particular colors of light, e.g., to produce white light. A particulate material, such as $TiO_2$ or $Al_2O_3$, may be used in conjunction with the phosphor material 22 to diffuse light generated by the light source 36. Such a light scattering material may be included with the phosphor material 22 or separately disposed as a layer between the inner surface of the housing 38 and the phosphor material 22. For a fluorescent tube, it may be advantageous to have the median size of the particles of the scattering material range from about 10 nm to about 400 nm.

Although the light source 36 shown in FIG. 5 has a straight housing 38, other housing shapes may be used. For example, a compact fluorescent lamp may have a housing 38 that has one or more bends or is in a spiral shape, with electrical supply pins 48 that are disposed at one end of the light source 36.

The applications of lighting apparatuses using inventive phosphors described herein are not limited to the particularly preferred general illumination purposes. They may include, among others, backlighting applications (such as in cellular phones, PDA's, computer monitors, and TV sets), as well as display, traffic, automotive, signage and other specialty lighting applications.

Examples and Blend Calculations

The techniques described above were used to synthesize five phosphors that have general formula I. The chemical components used to produce each of the phosphors are shown in Table 1. The resulting formulas are presented in Table 2.

For each of the first four phosphors A-D, the amounts of the listed components were mixed as powders and placed into an open high purity alumina crucible. The crucible containing the powder blend was then fired under a $N_2$ atmosphere to which between about 0.75 volume percent to about 1.5 volume % $H_2$ was added. The firing was conducted in six stages, and between each firing stage, the phosphor was removed from the furnace and passed through a grinding step. The phosphors were fired for about 10 hours at 750° C., 10 hours at 850° C., 10 hours at 950° C., 10 hours at 1100° C., 10 hours at 1200° C., and 6 hours at 1300° C.

TABLE 1

Summary of Phosphor Components used in Syntheses[1]

| | Phosphor A | Phosphor B | Phosphor C | Phosphor D | Phosphor E |
|---|---|---|---|---|---|
| $SrCO_3$ | 4.836 | 4.988 | 5.142 | 3.808 | 6.3574 |
| $CaCO_3$ | 0.0 | 0.0 | 0.0 | 1.018 g | 3.8031 |
| $SrF_2$ | 0.843 | 0.767 | 0.640 | 0.926 (33% excess[2]) | 1.6905 (25% excess[2]) |
| NaF | 0.017 | 0.017 | 0.017 | 0.019 | 0 |
| $CeO_2$ | 0.069 | 0.070 | 0.070 | 0.076 | 0.0817 |
| $Al(NO_3)_3 \cdot 9H_2O$ | 5.036 | 4.581 | 3.820 | 4.247 | 0 |
| $SiO_2$ | 0.0 | 0.082 | 0.204 | 0.221 | 0.7611 |
| $Al_2O_3$ | 0 | 0 | 0 | 0 | 0.9685 |

[1]All values are in grams.
[2]Excess amounts of fluorinated compounds may be added as flux, as described previously.

Phosphor E was produced using a newer technique to determine if the procedures described above could be simplified. For Phosphor E, the component powders were dry-blended using $ZrO_2$ media and then placed into a high purity alumina crucible. The powder mixture was fired at about 850° C. for about 10 hrs in a $N_2$ atmosphere containing about 1 volume % $H_2$. After the 1st firing, the sample was re-ground using a mortar and pestle and then fired for a second time at 1200° C. for 8 hrs in a $N_2$ atmosphere containing about 1 volume % $H_2$. After the second firing, the sample was ground and passed through a 270 mesh screen.

TABLE 2

Formulas of Example Phosphors Produced

| Name | Formula |
|---|---|
| Phosphor A | $(Sr_{0.98}Na_{0.01}Ce_{0.01})_3AlO_4F$ |
| Phosphor B | $(Sr_{0.98}Na_{0.01}Ce_{0.01})_3(Al_{0.9}Si_{0.1})O_{4.1}F_{0.9}$ |
| Phosphor C | $(Sr_{0.98}Na_{0.01}Ce_{0.01})_3(Al_{0.8}Si_{0.2})O_{4.2}F_{0.8}$ |
| Phosphor D | $(Sr_{0.75}Ca_{0.23}Na_{0.01}Ce_{0.01})_3(Al_{0.75}Si_{0.25})O_{4.25}F_{0.75}$ |
| Phosphor E | $(Sr_{0.595}Ca_{0.4}Ce_{0.005})_3(Al_{0.6}Si_{0.4})O_{4.415}F_{0.585}$ |

The emission spectra for the five phosphors described above are shown in the chart 50 presented in FIG. 6. In the chart 50, the y-axis 52 plots emission intensity in relative units and the x-axis 54 plots the wavelength in nanometers (nm). The excitation wavelength for all five spectra was 405 nm. The emission spectrum of phosphor A is indicated by reference numeral 56, phosphor B by reference numeral 58, phosphor C by reference numeral 60, phosphor D by reference numeral 62, and phosphor E by reference numeral 64. In all cases, the emission is generally blue-green to green-yellow, e.g., having a peak emission wavelength between about 485 nm and about 540 nm.

The quantum efficiency at a wavelength of 405 nm of each of the five phosphors was measured against a known phosphor, $Sr_4Al_{14}O_{25}:Eu^{2+}$ (SAE) with the results shown in the column labeled QE/Abs in Table 2, wherein the relative efficiency of the example phosphor versus SAE is the first number (before the slash) and the absorbance at the excitation wavelength (about 405 nm) is the second number. With the exception of phosphor A, the quantum efficiency of the example phosphors were at least within about 10% of the standard phosphor (SAE).

The decrease in quantum efficiency at 150° C. versus ambient temperature (about 20° C. to 25° C.) was also measured with the results shown in Table 3. As can be seen, the quantum efficiency remained within about 20% of that of ambient quantum efficiency for all of the example phosphors. In contrast, the quantum efficiency of the SAE standard decreases by about 40% at 150° C.

TABLE 3

Optical Characteristics of Example Phosphors

| Phosphor | Qe/Abs (at 405 nm) | Thermal derating at 150° C. | x | y |
|---|---|---|---|---|
| A | 81/90 | 18% | 0.230 | 0.394 |
| B | 91/89 | 15% | 0.293 | 0.495 |
| C | 95/92 | 15% | 0.331 | 0.534 |
| D | 90/90 | 16.5% | 0.387 | 0.544 |
| E | 103/74 | 13% | 0.384 | 0.537 |

Figure 6:
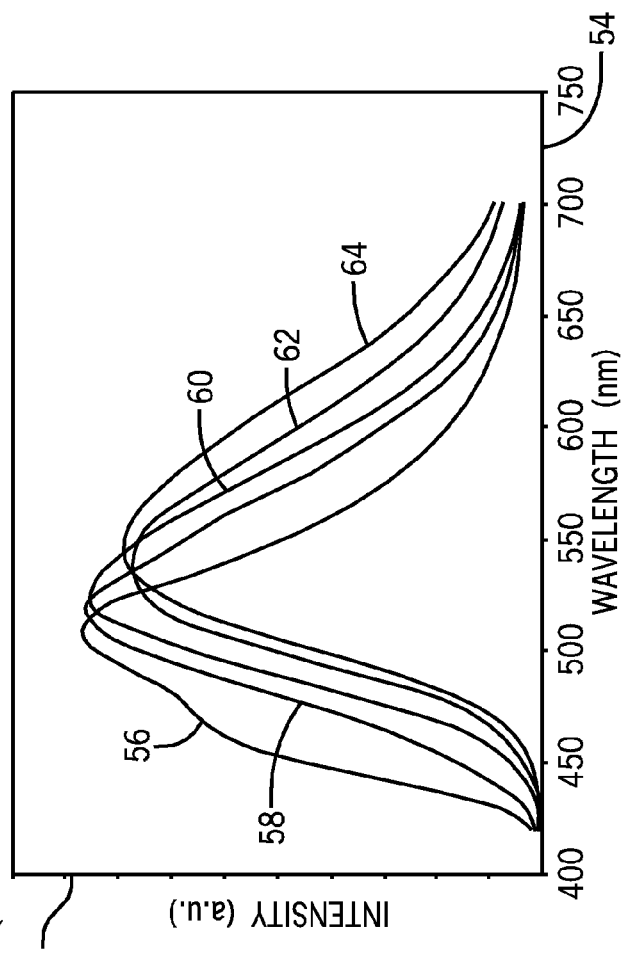
FIG. 6 is a chart of the emission spectra of five phosphors using a 405 nm excitation wavelength, in accordance with embodiments.
Figure 7:
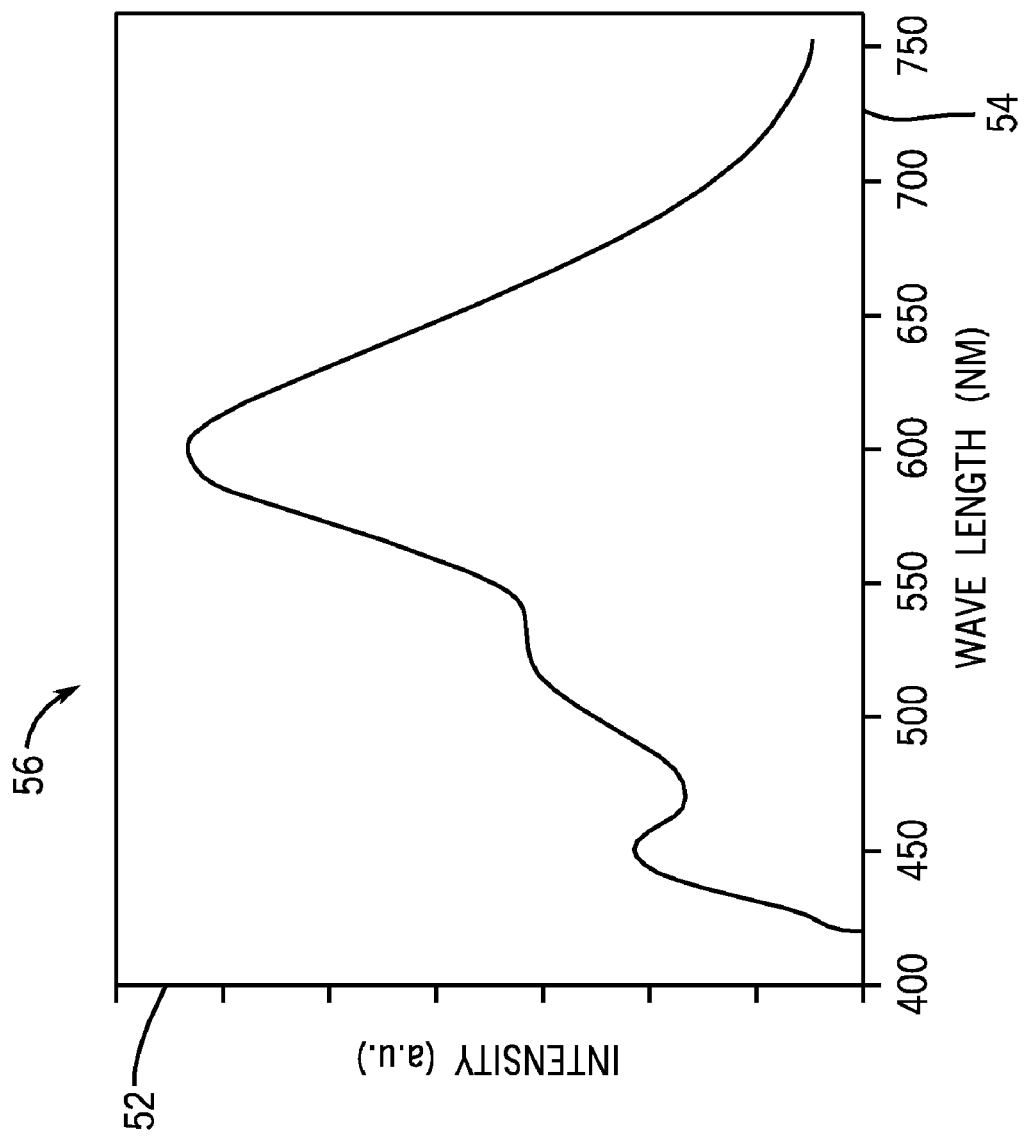
FIG. 7 is a chart of a calculated emission spectrum for a phosphor blend containing the phosphors SECA, "Orange", and Phosphor C of the present techniques.
Figure 8:
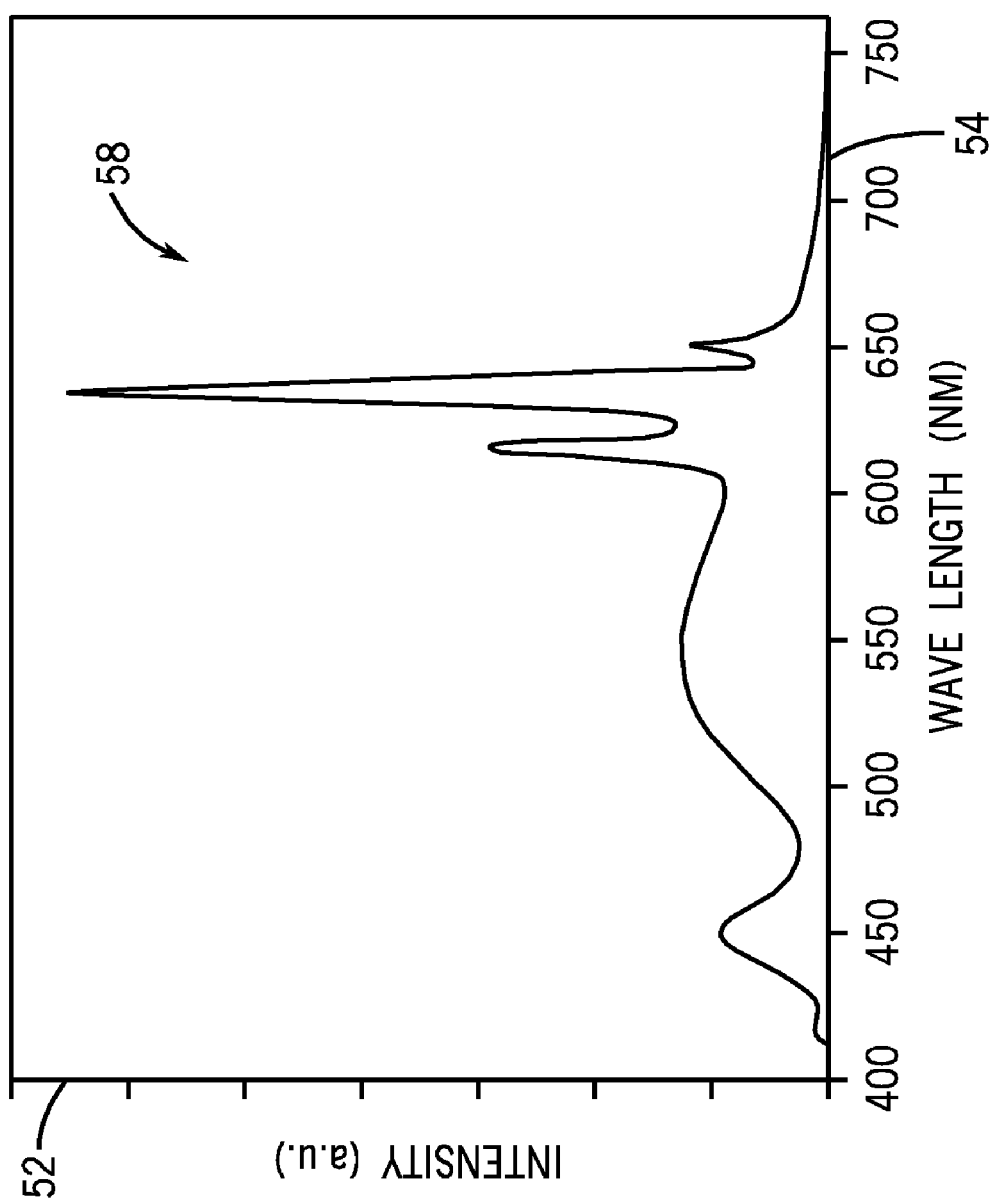
FIG. 8 is a chart of a calculated emission spectrum for an emission source and a phosphor blend containing the phosphors PFS and Phosphor D of the present techniques.
Figure 9:
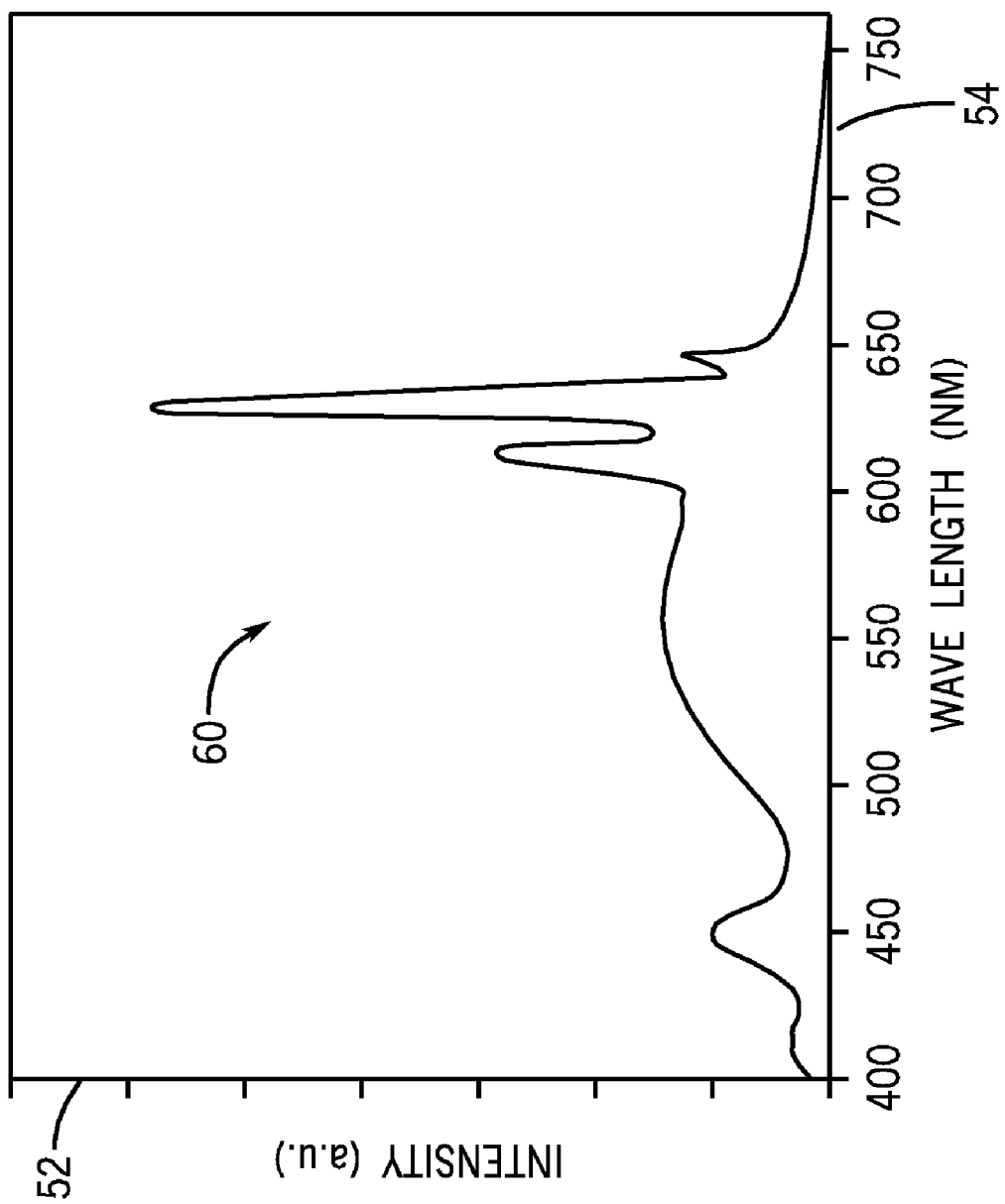
FIG. 9 is a chart of a calculated emission spectrum for an emission source and a phosphor blend containing the phosphors SASI, PFS and Phosphor D of the present techniques.

The emission spectra of the example phosphors, as shown in FIG. 6, may be used to calculate the spectral characteristics that may be obtained for blends with other phosphors. For example, the spectra of phosphors having the formulas indicated in Table 3 were used in calculations with the emission spectra of the example phosphors to predict emission spectra for blends. Further, the calculations also included any visible light emitted by the source. Examples of predicted spectra are shown in FIGS. 7-9, which correspond to the blends in rows 3 (spectrum 56), 24 (spectrum 58), and 30 (spectrum 60) of Table 5. The spectral characteristics calculated from the predicted spectra for these blends and various other blends of the phosphors listed in Table 4 with phosphors A-D of the present techniques are presented in Table 4. It should be noted that the precise concentration of the phosphors that may be used in actual physical blends depends on the absolute quantum efficiency of the various phosphors. Since the efficiency of individual phosphors may vary widely, the amounts of each phosphor needed are best determined empirically, such as through standard design of experiment (DOE) techniques, or other experimental techniques known in the art.

TABLE 4

Formulas of Additional Phosphors Used in Blend Calculations

| Name | Formula |
|---|---|
| Orange | $Ca_2Si_5N_8: Ce^{3+},Eu^{2+}$ |
| SECA | $(Ba,Sr,Ca)_5(PO_4)_3(Cl,F,Br,OH): Eu^{2+}$ |
| Yellow | $Ca_{1.5}Al_3Si_9N_{16}: Ce^{3+},Eu^{2+}$ |
| PFS | $K_2[SiF_6]: Mn^{4+}$ |
| SASI | $(Ba,Sr,Ca)_2Si_{1-x}O_{4-2x}: Eu^{2+}$ (wherein $0 \leq x \leq 0.2$) |

As previously discussed, the CIE color coordinates of the emitted light (x, y) is a measured characteristic that may be used in choosing phosphors and phosphor blends for illumination applications. Further, lower values for color temperatures (CCT) indicates that the light has more intensity at red wavelengths, while higher values may indicate light that has more intensity at blue wavelengths. The spectral distribution may also be used to determine the CRI, as well as the luminosity values.

As can be seen from the values in Table 5, the phosphors of the present techniques could be used to obtain blends generating white light with a low CCT. The calculations also indicate that the present phosphors could be used to obtain blends generating white light with a high CRI, for example, greater than about 80 or greater than about 90. Accordingly, the phosphors of the present techniques may be used in blends to form illumination systems that are useful in general lighting systems, such as white light lamps. Further, their weak thermal derating may assist in preventing dimming or color shifting as the temperature of the phosphor in the illumination systems increases.

Additionally, as indicated by the calculations shown in rows 23-32, favorable results may also be obtained by combining the emission from a light source, e.g., a blue LED chip having a peak wavelength of 450 nm, with the phosphors of the present techniques or their blends. Advantageously, this combination can produce white light having a high CRI and a tunable CCT, e.g. from 2700K to 6500K.

While only certain features of the present techniques have been illustrated and described herein, many modifications and changes will occur to those skilled in the art. It is, therefore, to be understood that the appended claims are intended to cover all such modifications and changes as fall within the true spirit of the present techniques.

TABLE 4

Spectral Characteristics of Example Phosphor Blends

| No. | Phosphor Components | CCT | CRI | Lm/Wopt | CIE x | CIE y |
|---|---|---|---|---|---|---|
| 1 | Phosphor A/Orange/Phosphor C | 2700K | 84 | 300 | 0.460 | 0.411 |
| 2 | SECA/Orange/Phosphor C | 2700K | 82 | 310 | 0.460 | 0.411 |
| 3 | SECA/Orange/Phosphor C | 3000K | 85 | 312 | 0.437 | 0.405 |
| 4 | Phosphor A/Orange/Phosphor C | 3000K | 86 | 298 | 0.437 | 0.405 |
| 5 | SECA/Orange/Phosphor C | 4100K | 89 | 308 | 0.376 | 0.375 |
| 6 | SECA/Orange/Phosphor B | 4100K | 91 | 301 | 0.376 | 0.375 |
| 7 | SECA/Orange/Phosphor B | 5000K | 93 | 293 | 0.345 | 0.352 |
| 8 | SECA/Orange/Phosphor C | 5000K | 91 | 300 | 0.345 | 0.352 |
| 9 | SECA/Orange/Phosphor C | 6500K | 92 | 287 | 0.314 | 0.323 |
| 10 | SECA/Orange/Phosphor B/Phosphor C | 6500K | 95 | 281 | 0.314 | 0.323 |
| 11 | SECA/Yellow/Phosphor C | 2700K | 56 | 379 | 0.460 | 0.411 |
| 12 | SECA/Yellow/Phosphor C | 3000K | 62 | 373 | 0.437 | 0.405 |
| 13 | SECA/Yellow/Phosphor C | 3500K | 68 | 363 | 0.406 | 0.392 |
| 14 | SECA/Yellow/Phosphor C | 4100K | 73 | 350 | 0.376 | 0.375 |
| 15 | SECA/Yellow/Phosphor C | 5000K | 77 | 332 | 0.345 | 0.352 |
| 16 | SECA/Yellow/Phosphor C | 6500K | 81 | 311 | 0.314 | 0.323 |
| 17 | Phosphor A/Orange/Phosphor D | 2700K | 80 | 316 | 0.460 | 0.411 |
| 18 | Phosphor A/Orange/Phosphor D | 3000K | 82 | 318 | 0.437 | 0.405 |
| 19 | Phosphor A/Orange/Phosphor D | 3500K | 84 | 319 | 0.406 | 0.392 |
| 20 | Phosphor A/Orange/Phosphor D | 4100K | 86 | 316 | 0.376 | 0.375 |
| 21 | Phosphor A/Orange/Phosphor D | 5000K | 86 | 308 | 0.345 | 0.352 |
| 22 | Phosphor A/Orange/Phosphor D | 6500K | 87 | 295 | 0.314 | 0.323 |
| 23 | Blue Chip/Phosphor D/PFS | 2700K | 84 | 330 | 0.460 | 0.411 |
| 24 | Blue Chip/Phosphor D/PFS | 3000K | 88 | 332 | 0.437 | 0.405 |
| 25 | Blue Chip/Phosphor D/PFS | 3500K | 92 | 331 | 0.406 | 0.392 |
| 26 | Blue Chip/Phosphor D/PFS | 4100K | 93 | 327 | 0.376 | 0.375 |
| 27 | Blue Chip/Phosphor D/PFS | 5000K | 91 | 319 | 0.345 | 0.352 |
| 28 | Blue Chip/Phosphor D/PFS | 6500K | 87 | 305 | 0.314 | 0.323 |
| 29 | Blue Chip/SASI/Phosphor D/PFS | 2700K | 95 | 330 | 0.460 | 0.411 |
| 30 | Blue Chip/SASI/Phosphor D/PFS | 3000K | 95 | 332 | 0.437 | 0.405 |
| 31 | Blue Chip/SASI/Phosphor D/PFS | 3500K | 94 | 332 | 0.406 | 0.392 |
| 32 | Blue Chip/SASI/Phosphor D/PFS | 4100K | 93 | 327 | 0.376 | 0.375 |

The invention claimed is:

1. A method for producing a phosphor, the method comprising:
   providing amounts of oxygen-containing compounds of cerium, silicon, and at least one alkaline-earth metal selected from the group consisting of Sr, Ba, Ca, and combinations thereof;
   mixing together the oxygen-containing compounds with a fluoride containing compound to form a mixture; and
   then firing the mixture at a temperature between about 900° C. and about 1700° C. under a reducing atmosphere for a sufficient period of time to convert the mixture to a phosphor comprising a general formula of $((Sr_{1-z}M_z)_{1-(x+w)}A_wCe_x)_3(Al_{1-y}Si_y)O_{4+y+3(x-w)}F_{1-y-3(x-w)}$, wherein $0<x\leq0.10, 0<y\leq0.5, 0\leq z\leq0.5, 0\leq w\leq x$, A is Li, Na, K, or any combinations thereof, M is Ca, Ba, or any combinations thereof; and light emitted by the phosphor is blue-green to green in color, having a peak emission wavelength between about 485 nm and about 540 nm, using a 405 nm excitation wavelength.

2. The method according to claim 1, wherein the oxygen-containing compounds are selected from the group consisting of oxides, hydroxides, carbonates, nitrates, aluminates, silicates, citrates, oxalates, carboxylates, tartarates, stearates, and combinations thereof.

3. A phosphor of formula $$((Sr_{1-z}M_z)_{1-(x+w)}A_wCe_x)_3(Al_{1-y}Si_y)O_{4+y+3(x-w)}F_{1-y-3(x-w)},$$

wherein
   $0<x\leq0.10$;
   $0<y\leq0.5$;
   $0\leq z\leq0.5$;
   $0\leq w\leq x$;
   A is Li, Na, K, or a combination thereof;
   M is Ca, Ba, Mg, or a combination thereof; and
   light emitted by the phosphor under 405 nm excitation, is blue-green to green in color, having a peak emission wavelength between about 485 nm and about 540 nm, using a 405 nm excitation wavelength.

4. A phosphor according to claim 3, of formula $$((Sr_{1-z}M_z)_{1-x}Ce_x)_3(Al_{1-y}Si_y)O_{4+y+3x}F_{1-y-3x}.$$

5. A phosphor according to claim 3, wherein M is Ca.

6. A phosphor according to claim 3, wherein $0<x\leq0.015$.

7. A phosphor according to claim 4, wherein M is Ca and $0<x\leq0.015$.

8. A phosphor according to claim 3, of formula $$(Sr_{0.595}Ca_{0.4}Ce_{0.005})_3(Al_{0.6}Si_{0.4})O_{4.415}F_{0.585}.$$

9. A phosphor according to claim 3, of formula $$(Sr_{0.98}Na_{0.01}Ce_{0.01})_3(Al_{0.9}Si_{0.1})O_{4.1}F_{0.9}.$$

10. A phosphor according to claim 3, of formula $$(Sr_{0.98}Na_{0.01}Ce_{0.01})_3(Al_{0.8}Si_{0.2})O_{4.2}F_{0.8}.$$

11. A phosphor according to claim 3, of formula $$(Sr_{0.75}Ca_{0.23}Na_{0.01}Ce_{0.01})_3(Al_{0.75}Si_{0.25})O_{4.25}F_{0.75}.$$

12. A phosphor according to claim 3, having a quantum efficiency at about 150° C. that is at least about 80% of the quantum efficiency at a temperature of between about 15° C. and about 25° C.

13. A phosphor according to claim 3, having a quantum efficiency of at least about 90% of the quantum efficiency of the reference phosphor $Sr_4Al_{14}O_{25}:Eu^{2+}$ at a temperature of between about 15° C. and about 25° C.

14. A phosphor blend comprising a blue-green to green phosphor having a peak emission wavelength between about 485 nm and about 540 nm, using a 405 nm excitation wavelength, of formula $$((Sr_{1-z}M_z)_{1-x+w}A_wCe_x)_3(Al_{1-y}Si_y)O_{4+y+3(x-w)}F_{1-y-(x-w)},$$

wherein
   $0<x\leq0.10$;
   $0<y\leq0.5$;
   $0\leq z\leq0.5$;
   $0\leq w\leq x$;
   A is Li, Na, K, or a combination thereof; and
   M is Ca, Ba, Mg, or a combination thereof.

15. A phosphor blend according to claim 14, additionally comprising a complex fluoride doped with $Mn^{4+}$; $(Ba,Sr,Ca)_5(PO_4)_3(Cl,F,OH):Eu^{2+}$; $Ca_2Si_5N_8:Ce^{3+},Eu^{2+}$; $(Lu,Ca,U,Mg,Y)_{1.5}Al_3Si_9N_{16}:Eu^{2+},Ce^{3+}$; $(Ba,Sr,Ca)_2Si_{1-a}O_{4-2a}:Eu^{2+}$ or a combination thereof.

16. A phosphor blend according to claim 14, wherein the blue-green to green phosphor is of formula $$((Sr_{1-z}M_z)_{1-x}Ce_x)_3(Al_{1-y}Si_y)O_{4+y+3x}F_{1-y-3x}.$$

17. A phosphor blend according to claim 14, wherein M is Ca.

18. A phosphor blend according to claim 14, wherein $0<x\leq0.015$.

19. A phosphor blend according to claim 14, wherein M is Ca and $0<x\leq0.015$.

20. A phosphor blend according to claim 14, wherein the blue-green to green phosphor is of formula $(Sr_{0.595}Ca_{0.4}Ce_{0.005})_3(Al_{0.6}Si_{0.4})O_{4.415}F_{0.585}.$ 21. A lighting apparatus comprising:
   a light source configured to emit radiation with a peak intensity at a wavelength between about 250 nm and about 550 nm; and
   a phosphor composition comprising a blue-green to green phosphor having a peak emission wavelength between about 485 nm and about 540 nm, using a 405 nm excitation wavelength, configured to be radiationally coupled to the light source, of formula $$((Sr_{1-z}M_z)_{1-(x+w)}A_wCe_x)_3(Al_{1-y}Si_y)O_{4+y+3(x-w)}F_{1-y-3(x-w)},$$

wherein
   $0<x\leq0.10$;
   $0<y\leq0.5$;
   $0\leq z\leq0.5$;
   $0\leq w\leq x$;
   A is Li, Na, K, or a combination thereof; and
   M is Ca, Ba, Mg, or a combination thereof.

22. A lighting apparatus according to claim 21, wherein the blue-green to green phosphor is of formula $$((Sr_{1-z}M_z)_{1-x}Ce_x)_3(Al_{1-y}Si_y)O_{4+y+3x}F_{1-y-3x}.$$

23. A lighting apparatus according to claim 21, wherein M is Ca.

24. A lighting apparatus according to claim 21, wherein $0<x\leq0.015$.

25. A lighting apparatus according to claim 21, wherein M is Ca and $0<x\leq0.015$.

26. A lighting apparatus according to claim 21, wherein the blue-green to green phosphor is of formula $(Sr_{0.595}Ca_{0.4}Ce_{0.005})_3(Al_{0.6}Si_{0.4})O_{4.415}F_{0.585}.$

* * * * *